(12) United States Patent
Moore et al.

(10) Patent No.: US 7,566,246 B2
(45) Date of Patent: Jul. 28, 2009

(54) COLLAR CLIP FOR AN ELECTRONIC MODULE

(75) Inventors: Joshua Moore, Sunnyvale, CA (US); Donald A. Ice, Milpitas, CA (US); Chris Togami, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/038,689

(22) Filed: Feb. 27, 2008

(65) Prior Publication Data

US 2008/0207039 A1 Aug. 28, 2008

Related U.S. Application Data

(60) Provisional application No. 60/892,199, filed on Feb. 28, 2007, provisional application No. 60/892,494, filed on Mar. 1, 2007.

(51) Int. Cl.
*H01R 13/648* (2006.01)
(52) U.S. Cl. ...................................................... 439/607
(58) Field of Classification Search ................. 439/607, 439/939; 385/92
See application file for complete search history.

(56) References Cited

U.S. PATENT DOCUMENTS 7,287,916 B2 * 10/2007 Mizue .......................... 385/92

2004/0037517 A1 2/2004 Dair et al.
2006/0215968 A1 9/2006 Kayner et al.
2007/0117458 A1 * 5/2007 Winker et al. ............... 439/607

OTHER PUBLICATIONS

Moore, Joshua et al., Positioning Plate for Optical Subassembly, U.S. Appl. No. 12/039,598, filed Feb. 28, 2008.
Moore, Joshua et al., Printed Circuit Board Positioning Mechanism, U.S. Appl. No. 12/038,708, filed Feb. 27, 2008.
Moore, Joshua et al., Rotatable Top Shell, U.S. Appl. No. 12/039,677, filed Feb. 28, 2008.
Moore, Joshua, Angular Seam for an Electronic Module, U.S. Appl. No. 12/038,721, filed Feb. 27, 2008.
Moore, Joshua, Optical Subassembly Positioning Device for an Electronic Module, U.S. Appl. No. 12/038,784, filed Feb. 27, 2008.

* cited by examiner

*Primary Examiner*—Phuong K Dinh
(74) *Attorney, Agent, or Firm*—Workman Nydegger

(57) ABSTRACT

In one example embodiment, a collar clip includes a body that is sized and configured to partially encircle a shell of an optoelectronic transceiver module. Each extended element in a pair of the extended elements is separated from the other extended element in the pair by a cavity. Each cavity is configured to receive a portion of a corresponding structure of the shell.

18 Claims, 6 Drawing Sheets

COLLAR CLIP FOR AN ELECTRONIC MODULE

CROSS REFERENCE TO RELATED APPLICATIONS

The present application claims priority to U.S. Provisional Patent Application Ser. No. 60/892,199, filed Feb. 28, 2007 and entitled "Electronic Module Mechanical Systems," and also claims priority to U.S. Provisional Patent Application Ser. No. 60/892,494, filed Mar. 1, 2007 and entitled "EMI Collar for Securing Shell Portions of a Communications Module," each of which is incorporated herein by reference in its entirety.

BACKGROUND

Electronic modules, such as electronic or optoelectronic transceiver or transponder modules, are increasingly used in electronic and optoelectronic communication. Electronic modules typically communicate with a printed circuit board of a host device by transmitting electrical signals to the printed circuit board and receiving electrical signals from the printed circuit board. These electrical signals can then be transmitted by the electronic module outside the host device as optical and/or electrical signals.

One common difficulty associated with the operation of electronic modules is the generation of electromagnetic radiation. The generation of electromagnetic radiation by an electronic module is a matter of significant concern because such electromagnetic radiation can cause electromagnetic interference ("EMI") with other systems and devices in the vicinity, which can seriously impair, if not prevent, the proper operation of those other systems and devices. Thus, the control of EMI effects is an important consideration in the design and use of electronic modules.

Another common difficulty associated with some electronic modules concerns the assembly of the modules. For example, an electronic module generally includes various components that must be secured within the module. Due to limitations in size and space, it can be difficult to secure components accurately and reliably within an electronic module.

SUMMARY OF SOME EXAMPLE EMBODIMENTS

In general, example embodiments of the invention relate to a collar clip for an electronic module.

In one example embodiment, a collar clip includes a body that is sized and configured to partially encircle a shell of an optoelectronic transceiver module. Each extended element in a pair of the extended elements is separated from the other extended element in the pair by a cavity. Each cavity is configured to receive a portion of a corresponding structure of the shell.

In another example embodiment, a collar clip includes a body that is sized and configured to partially encircle a multi-piece shell of an optoelectronic transceiver module. A first locking flange is defined on a first end of the body and a second locking flange defined on a second end of the body. The first and second locking flanges are each configured to releasably engage corresponding structure of the multi-piece shell such that the body holds at least two pieces of the multi-piece shell together when the first and second locking flanges are engaged with the corresponding structure.

In yet another example embodiment, an optoelectronic transceiver module includes a multi-piece shell, a PCB at least partially positioned within the multi-piece shell, a TOSA electrically connected to the PCB, a ROSA electrically connected to the PCB, and a collar clip. At least one piece of the multi-piece shell defines a plurality of posts. The collar clip includes a body that partially encircles the multi-piece shell. The collar clip also includes a plurality of extended elements located on at least one edge of the body. Each extended element in a pair of the extended elements is separated from the other extended element in the pair by a cavity. Each of the plurality of posts is positioned in a respective cavity. The collar clip further includes a first locking flange defined on a first end of the body and a second locking flange defined on a second end of the body. Each of the first and second locking flanges engages corresponding structure of the multi-piece shell such that the body holds at least two pieces of the multi-piece shell together.

These and other aspects of example embodiments of the invention will become more fully apparent from the following description and appended claims.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION OF SOME EXAMPLE EMBODIMENTS

Example embodiments of the present invention relate to a collar clip for an electronic module. Some example collar clips disclosed herein can be employed in connection with an electronic module positioned in a host device. When so employed, the example collar clip can help maintain electromagnetic radiation emitted outside the host device at acceptably low levels to avoid electromagnetic interference ("EMI") in surrounding devices. Some example embodiments of the invention can aid in securing two or more pieces of a multi-piece shell of the electronic module together.

Reference will now be made to the drawings to describe various aspects of some example embodiments of the invention. It is to be understood that the drawings are diagrammatic and schematic representations of such example embodiments, and are not limiting of the present invention, nor are they necessarily drawn to scale.

1. Example Optoelectronic Transceiver Module

Figure 1A:
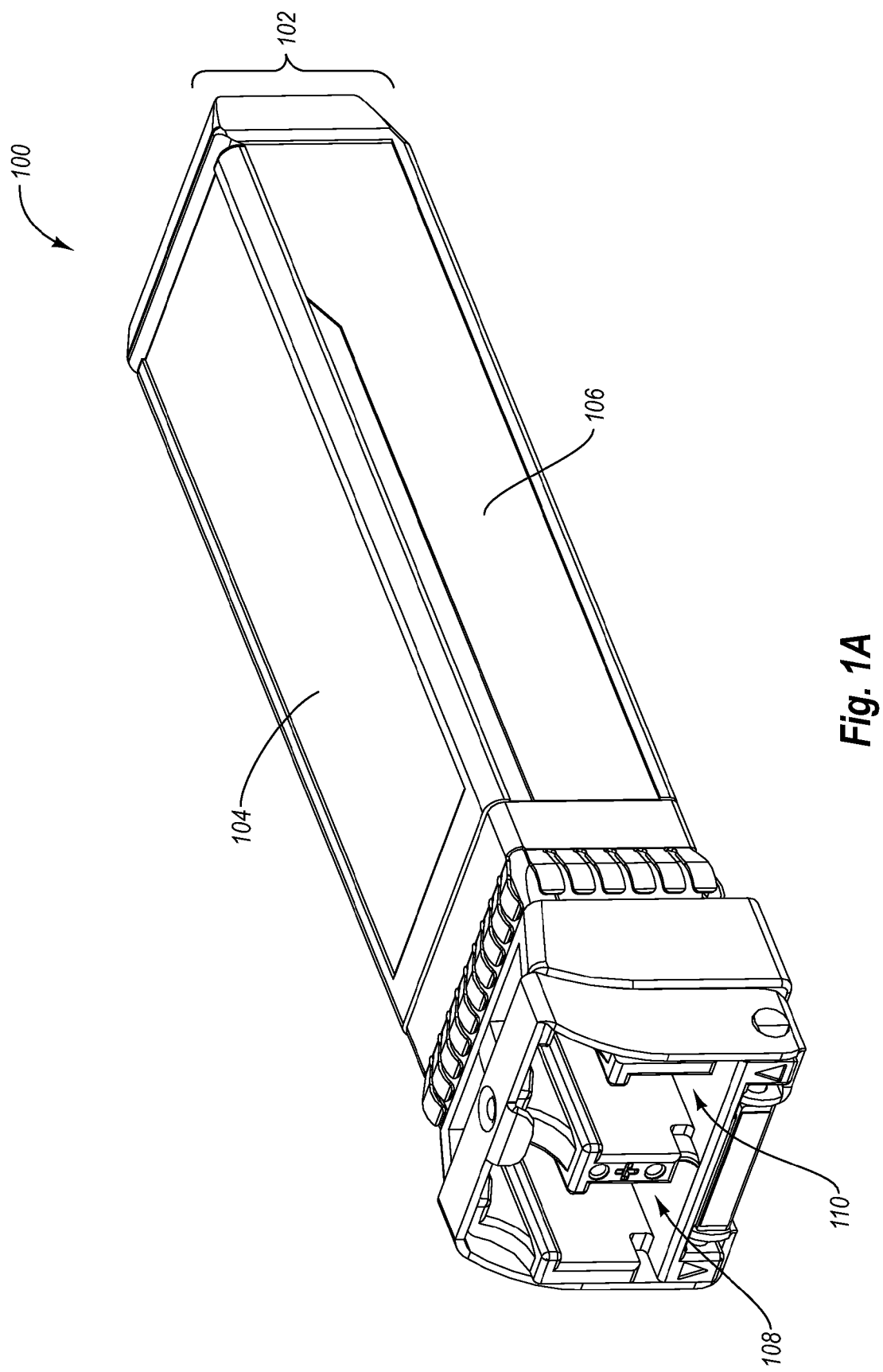
FIGS. 1A-1C disclose aspects of an example optoelectronic transceiver module.
Figure 1B:
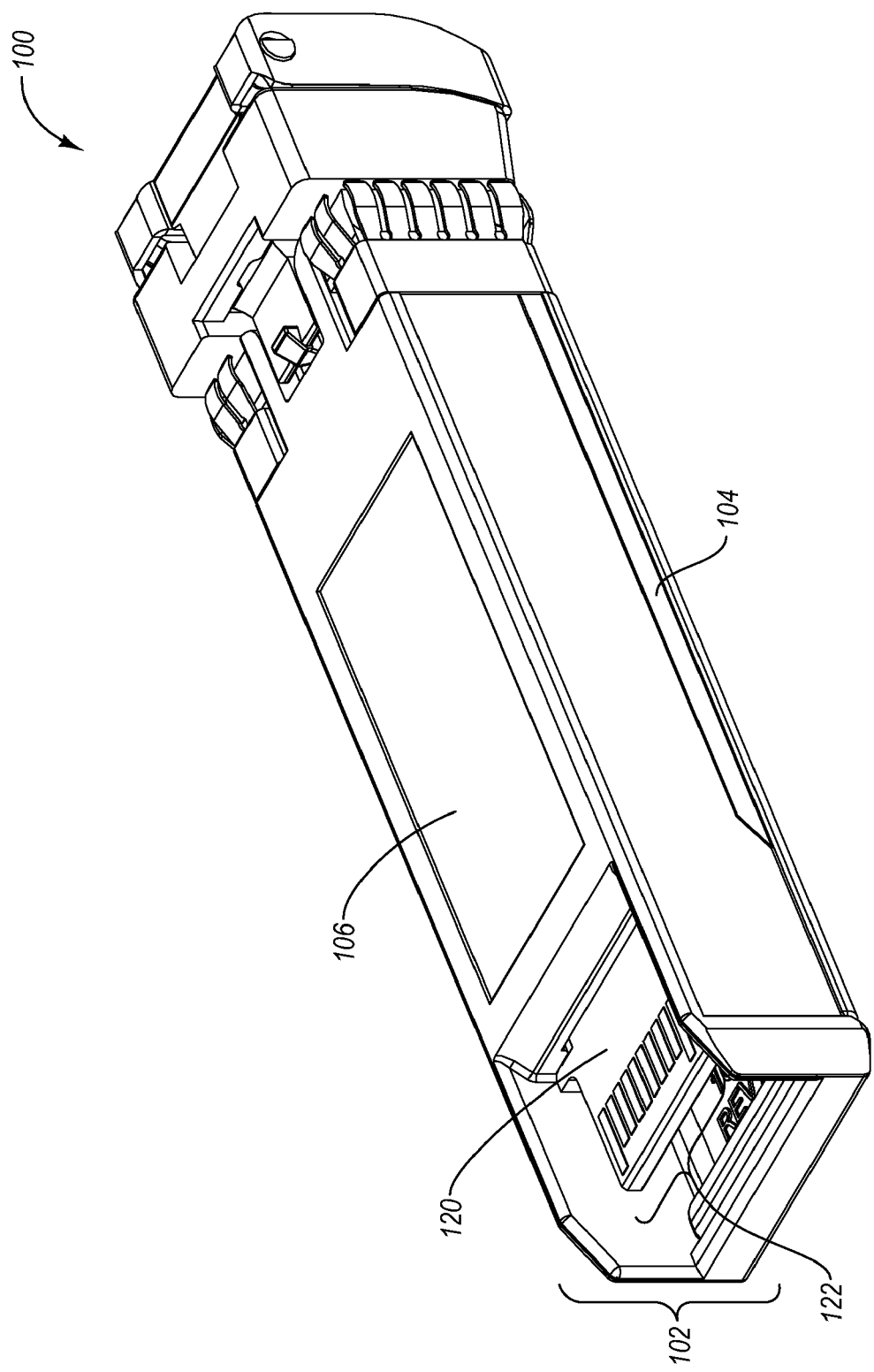
Figure 1C:
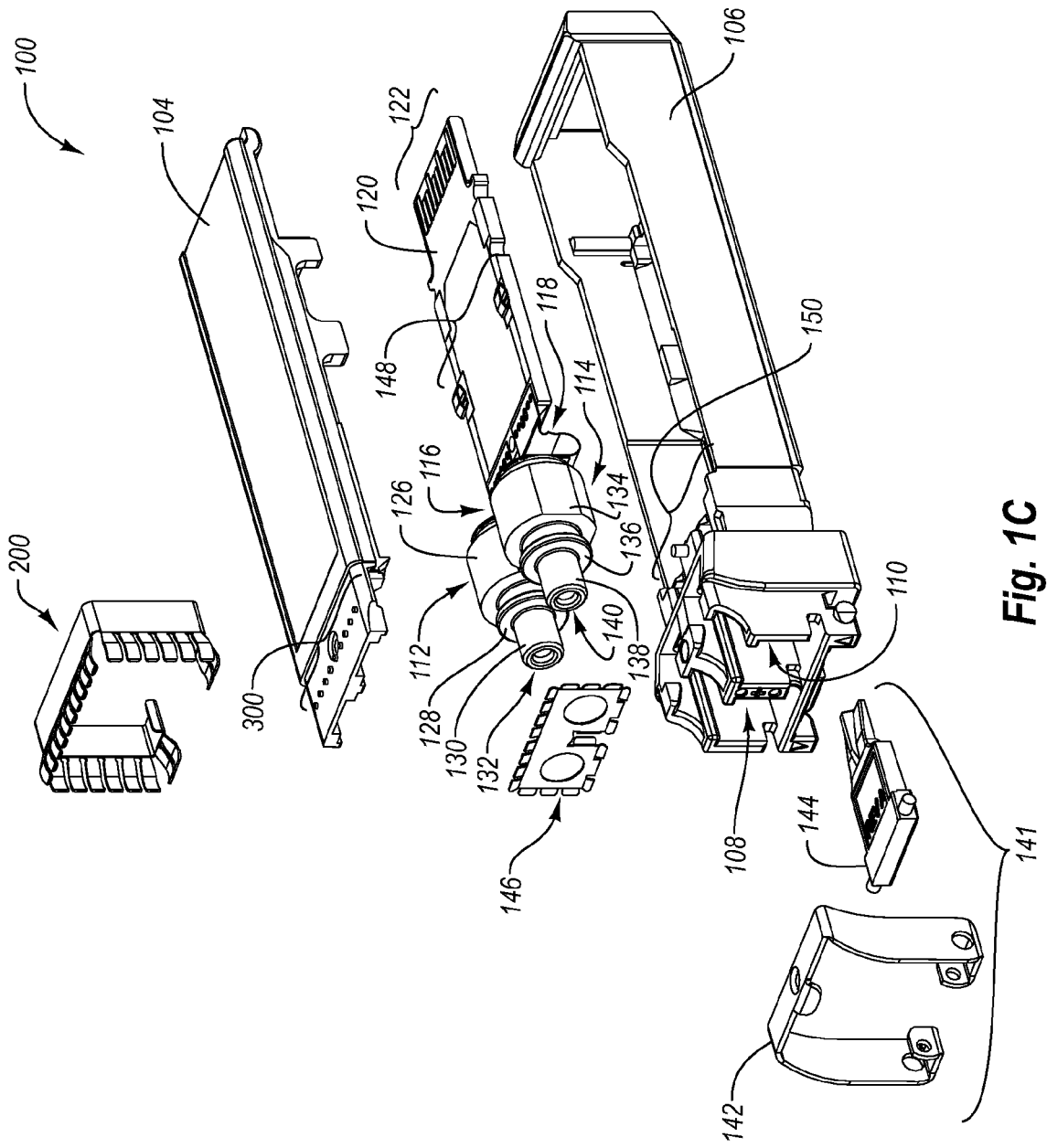

Reference is first made to FIGS. 1A-1C which disclose aspects of an example optoelectronic transceiver module 100 for use in transmitting and receiving optical signals in connection with a host device (not shown). As disclosed in FIGS. 1A and 1B, the optoelectronic transceiver module 100 includes various components, including a shell 102 that includes a rotatable top shell 104 and a bottom shell 106. The rotatable top shell 104 is rotatable with respect to the bottom shell 106. An output port 108 and an input port 110 are defined in the bottom shell 106. The rotatable top shell 104 and the bottom shell 106 can be formed using a die casting process, machining operation, or any other suitable process(es). One example material from which the rotatable top shell 104 and the bottom shell 106 can be die cast is zinc, although the rotatable top shell 104 and the bottom shell 106 may alternatively be die cast or otherwise constructed from other suitable materials such as aluminum, or any other suitable material(s).

As disclosed in FIG. 1C, the example optoelectronic transceiver module 100 also includes a transmitter optical subassembly ("TOSA") 112, a receiver optical subassembly ("ROSA") 114, electrical interfaces 116 and 118, and a printed circuit board ("PCB") 120 having an edge connector 122. The two electrical interfaces 116 and 118 are used to electrically connect the TOSA 112 and the ROSA 114, respectively, to the PCB 120.

The TOSA 112 of the optoelectronic transceiver module 100 includes a barrel 126 within which an optical transmitter, such as a laser, (not shown) is disposed. The optical transmitter is configured to convert electrical signals received through the PCB 120 from a host device (not shown) into corresponding optical signals. The TOSA 112 also includes a flange 128 and a nose piece 130. The nose piece 130 defines a port 132. The port 132 is configured to optically connect the optical transmitter disposed within the barrel 126 with a fiber-ferrule (not shown) disposed within the output port 108.

Similarly, the ROSA 114 of the optoelectronic transceiver module 100 includes a barrel 134, a flange 136, and a nose piece 138. The nose piece 138 defines a port 140. The port 140 is configured to optically connect an optical receiver, such as a photodiode (not shown), disposed within the barrel 134 to a fiber-ferrule (not shown) disposed within the input port 110. The optical receiver is configured to convert optical signals received from the fiber-ferrule into corresponding electrical signals for transmission to a host device (not shown) through the PCB 120.

The optoelectronic transceiver module 100 can be configured for optical signal transmission and reception at a variety of per-second data rates including, but not limited to, 1 Gbit, 2 Gbit, 2.5 Gbit, 4 Gbit, 8 Gbit, 10 Gbit, 17 Gbit, 40 Gbit, 100 Gbit, or higher. Furthermore, the optoelectronic transceiver module 100 can be configured for optical signal transmission and reception at various wavelengths including, but not limited to 850 nm, 1310 nm, 1470 nm, 1490 nm, 1510 nm, 1530 nm, 1550 nm, 1570 nm, 1590 nm, or 1610 nm. Further, the optoelectronic transceiver module 100 can be configured to support various communication standards including, but not limited to, Fast Ethernet, Gigabit Ethernet, 10 Gigabit Ethernet, and 1×, 2×, 4×, and 10× Fibre Channel. In addition, although one example of the optoelectronic transceiver module 100 is configured to have a form factor that is substantially compliant with the SFP+ (IPF) MSA, the optoelectronic transceiver module 100 can alternatively be configured to have a variety of different form factors that are substantially compliant with other MSAs including, but not limited to, the SFF MSA or the SFP MSA.

With continued reference to FIGS. 1A-1C, the optoelectronic transceiver module 100 also includes a latching mechanism 141 which includes a bail 142 and a latch 144. The optoelectronic transceiver module 100 further includes an optical sub-assembly ("OSA") positioning plate 146, a PCB positioning mechanism 148, a collar clip 200, an interlocking seam 300, and an angular seam 150. The collar clip 200 and the interlocking seam 300 will be discussed in greater detail below in connection with FIGS. 2A-2C.

2. Example Collar Clip

Figure 2A:
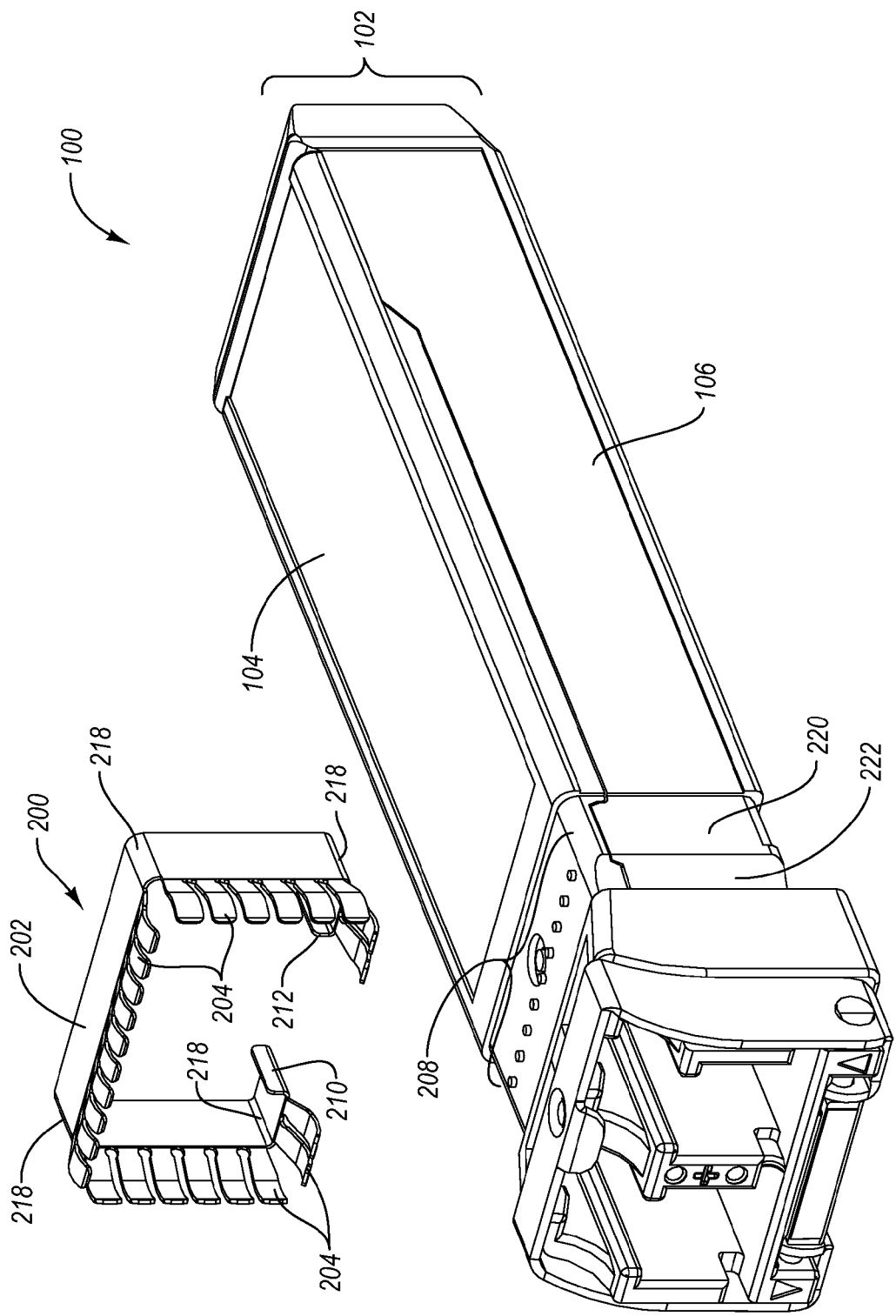
FIGS. 2A-2C disclose aspects of an example collar clip and an example interlocking seam.
Figure 2B:
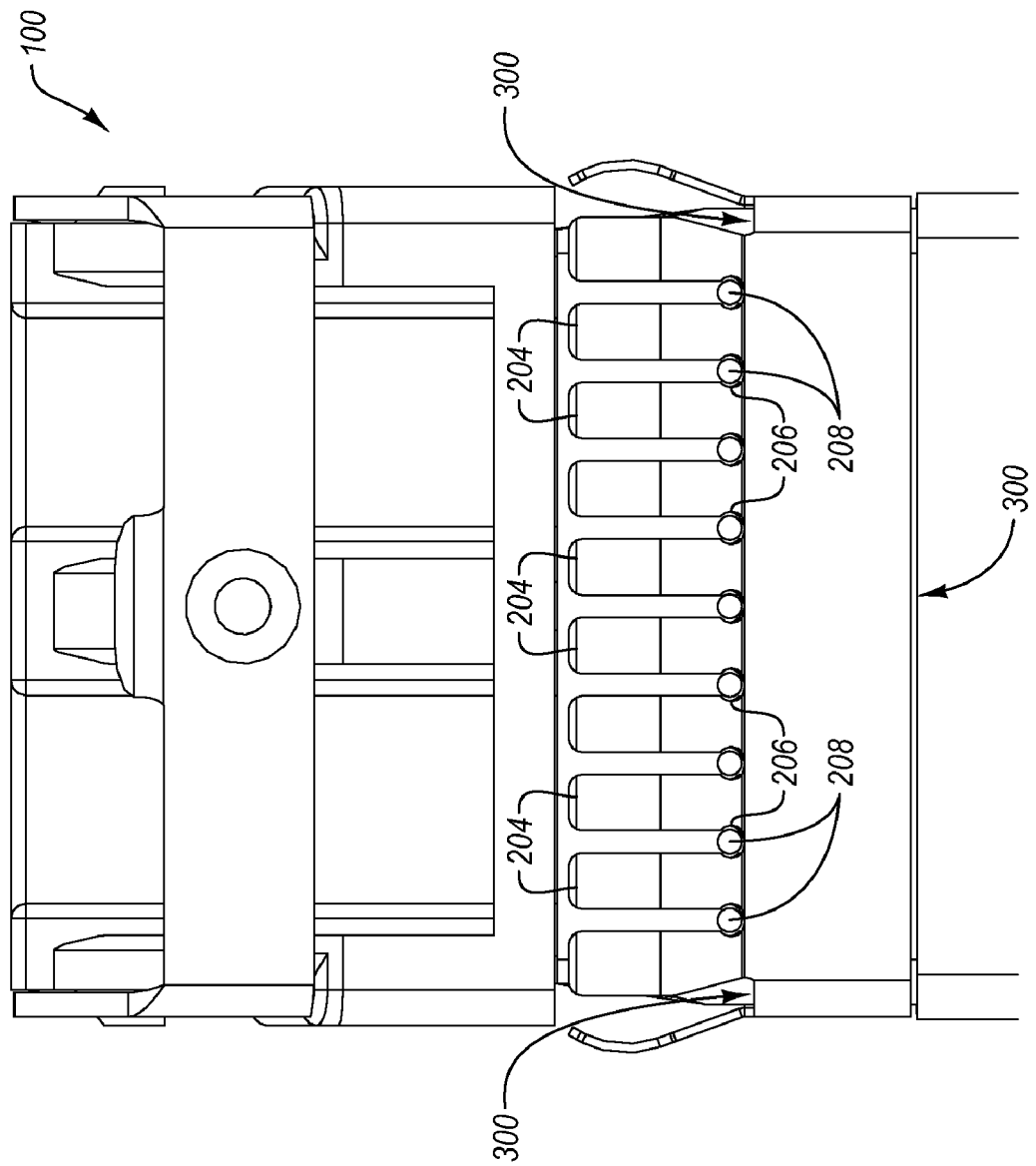
Figure 2C:
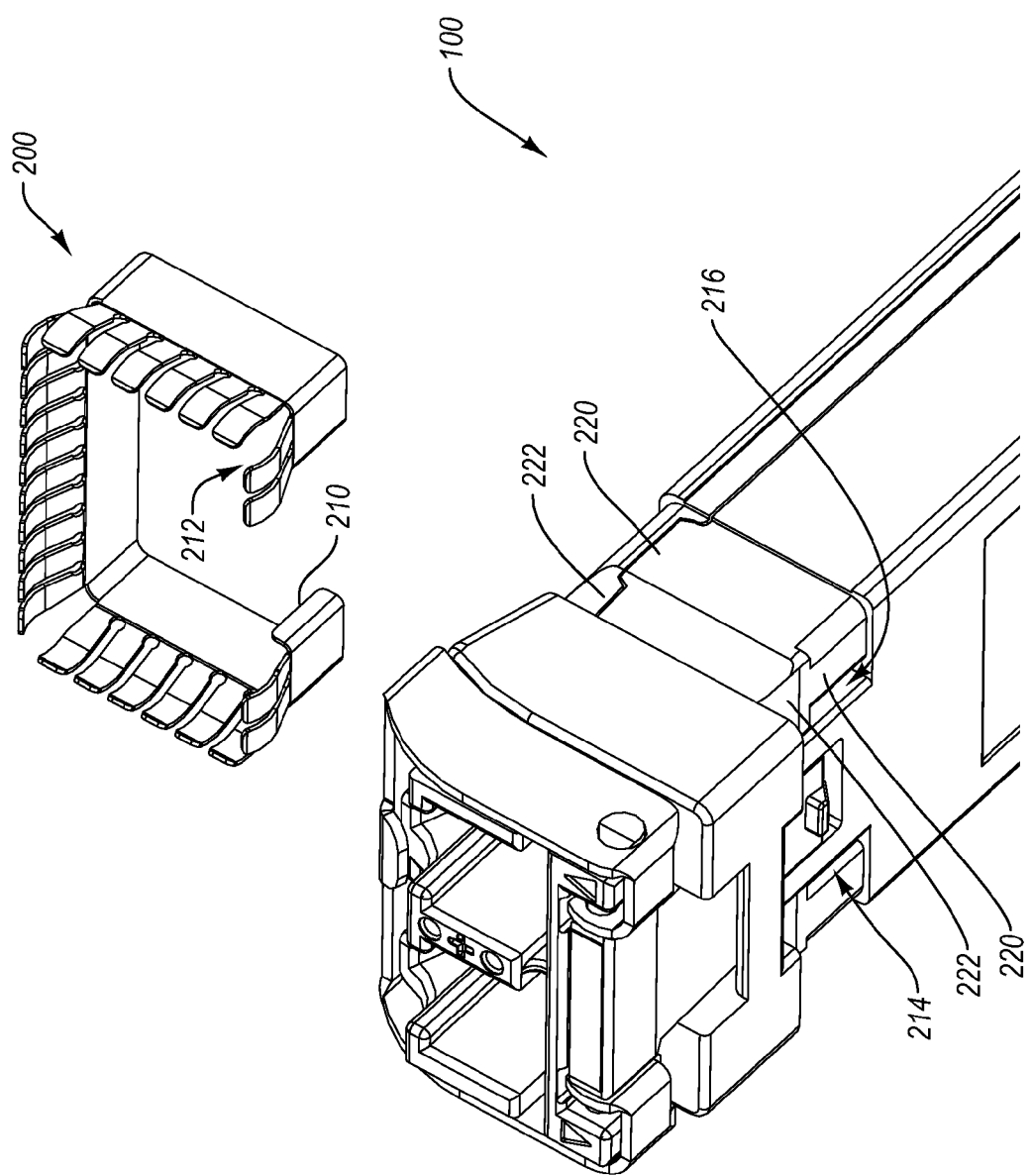

With reference now to FIGS. 2A-2C, aspects of an example collar clip 200 are disclosed. The example collar clip 200 can be formed from any suitable material including, but not limited to, 301 or 302 stainless steel sheet metal. In general, and as disclosed in FIGS. 2A and 2B, the example collar clip 200 includes a body 202 that is configured to partially surround and engage the rotatable top shell 104 and the bottom shell 106 of the optoelectronic transceiver module 100. The collar clip 200 also includes a plurality of extended elements 204 located around an edge of the body 202. The collar clip 200 further includes a plurality of substantially circular cavities 206 defined between some of the extended elements 204. Each of the cavities 206 is configured to receive a corresponding substantially circular post 208 defined in the rotatable top shell 104 of the optoelectronic transceiver module 100, as discussed in greater detail below.

The extended elements 204 are configured to contact a cage of a host device (not shown) when the optoelectronic transceiver module 100 is inserted into the host board and to elastically deform upon insertion of the optoelectronic transceiver module 100 into the cage, thereby helping to control electromagnetic radiation emissions from the cage of the host device. In general, the number of extended elements 204 can be maximized within the space and manufacturing constraints of the collar clip 200 in order to control electromagnetic radiation emissions from the cage of the host device. It is noted that the collar clip 200 is not limited to the example arrangement of extended elements 204 disclosed in FIGS. 2A-2C. For example, the number, size, spacing, shape, orientation, arrangement, and/or location of the extended elements of the collar clip 200 may vary.

As disclosed in FIGS. 2A and 2C, the collar clip 200 also includes a first locking flange 210 defined on a first end of the body 202 and a second locking flange 212 defined on a second end of the body 202. The first and second locking flanges 210 and 212 are configured to engage corresponding indentations 214 and 216, respectively, defined in the bottom shell 106 such that the collar clip 200 can hold the rotatable top shell 104 and the bottom shell 106 together after assembly of the optoelectronic transceiver module 100.

Prior to installation of the collar clip 200 to the rotatable top shell 104 and the bottom shell 106, the bends 218 in the body 202 may be bent at an angle less than the angles of the corners of the rotatable top shell 104 and the bottom shell 106. This over-bending of the bends 218 can cause the body 202 to be biased against and hug the rotatable top shell 104 and the bottom shell 106 after the collar clip 200 is installed on the optoelectronic transceiver module 100. It is noted that other portions of the collar clip 200 may be similarly over-bent in order for the body 202 to bias against and hug the rotatable top shell 104 and the bottom shell 106. Later, during the installation of the collar clip 200 to the rotatable top shell 104 and the bottom shell 106, the collar clip 200 can be elastically deformed as necessary for installation.

As disclosed in FIGS. 2A and 2C, the rotatable top shell 104 and the bottom shell 106 may cooperatively define a recess 220 configured to receive the body 202 of the collar clip 200. In this example, the body 202 or other structural feature is substantially flush, or below flush, with the adjacent surface of the rotatable top shell 104 and bottom shell 106 after the collar clip 200 is engaged with the optoelectronic transceiver module 100. Being flush or below flush may prevent edges of the collar clip 200 from catching on the host cage (not shown) during module insertion. Also, as disclosed in FIGS. 2A and 2C, the rotatable top shell 104 and the bottom shell 106 can include a pocket 222 along one or more sides of the shell 102 configured so that when the extended elements 204 of the collar clip 200 are inserted into and withdrawn from a cage of a host device (not shown), the extended elements 204 can fold in and thereby reduce the forces required to elastically deform the extended elements 204 and avoid the collar clip 200 from getting snagged or hung-up on the cage.

The example collar clip 200 is thus configured to secure the rotatable top shell 104 to the bottom shell 106 and thereby obviate the need for a screw or other fastener(s) to attach the rotatable top shell 104 and the bottom shell 106 together. In addition, the example collar clip 200 simultaneously performs an EMI control function in conjunction with a cage of a host device when the optoelectronic transceiver module 100 is plugged into the cage of the host device.

3. Example Interlocking Seam

With continuing reference to FIGS. 2A-2B, aspects of an example interlocking seam 300 are disclosed. In general, the example interlocking seam 300 comprises, or may be an element of, an interface between the top surface of the rotatable top shell 104 and the collar clip 200. As discussed above, the example collar clip 200 includes a plurality of cavities 206 defined between some of the extended elements 204. Each cavity 206 is configured to receive a corresponding post 208, formed along the top surface of the rotatable top shell 104, when the collar clip 200 is assembled into the optoelectronic transceiver module 100. The example interlocking seam 300 is configured to control electromagnetic radiation from the space between the collar clip 200 and the rotatable top shell 104.

In one example embodiment, the rotatable top shell 104 is formed from zinc casting and the collar clip 200 is formed from sheet metal. Although the body 202 of the collar clip 200 and the top surface of the zinc casting rotatable top shell 104 are, in at least some example embodiments, designed to fit flat against one another, long seams can often form along the length of the interface where the two materials are not completely flat. Electromagnetic radiation can radiate through these long seams in the interface. However, by including the cavities 206 that interlock with the posts 208, any long seams along the interlocking seam 300 are broken up, resulting in improved electromagnetic radiation containment at the interlocking seam 300.

It is noted that other metal-on-metal seam combinations are contemplated other than zinc casting-on-sheet metal. For example, where both the rotatable top shell 104 and the collar clip 200 are made from sheet metal, the principles of the example interlocking seam 300 still function to help improve electromagnetic radiation containment through the resulting sheet metal-on-sheet metal seam.

In addition, in some alternative embodiments of the interlocking seam 300, the cavities 206 and posts 208 can be located not only in the top surface of the shell 102 of the optoelectronic transceiver module 100, but also on the sides and bottom surface of the shell 102 of the optoelectronic transceiver module 100. The example interlocking seam 300 is therefore not limited to implementation in connection with any particular portion of a surface of the optoelectronic transceiver module 100.

In some alternative embodiments, the posts 208 or other suitable structures can be formed in the collar clip 200 and the cavities 206 or other suitable structural configurations can be formed in the shell 102. These alternative embodiments are an inverse of the interlocking seam 300 disclosed in FIGS. 2A and 2B because the posts 208 are formed on the collar clip 200 instead of on the shell 102, and the cavities 206 are formed in the shell 102 instead of in the collar clip 200.

In some alternative embodiments, the cavities 206 can be formed in a collar that does not also function to clip the top shell 104 and the bottom shell 106 together. The interlocking seam 300 is not limited, therefore, to implementations in a collar clip, but can be used instead in other suitable structures of the transceiver module 100 disclosed herein or in other devices.

Implementation of the example interlocking seam 300 can thus result in improved electromagnetic radiation containment between the rotatable top shell 104 and the collar clip 200 of the optoelectronic transceiver module 100.

The example embodiments disclosed herein may be embodied in other specific forms. The example embodiments disclosed herein are to be considered in all respects only as illustrative and not restrictive.

What is claimed is:

1. An optoelectronic transceiver module comprising:
   a shell defining a plurality of substantially circular posts positioned in a row along at least one side of the shell;
   a PCB at least partially positioned within the shell;
   a TOSA electrically connected to the PCB;
   a ROSA electrically connected to the PCB; and
   a collar clip comprising:
      a body sized and configured so as to partially encircle the shell;
      a plurality of extended elements located on at least one edge of the body, each extended element in a pair of the extended elements separated from the other extended element in the pair by a substantially circular cavity, each of the plurality of substantially circular posts being positioned in a respective substantially circular cavity.

2. The optoelectronic transceiver module as recited in claim 1, wherein the collar clip further comprises:
   a first locking flange defined on a first end of the body; and
   a second locking flange defined on a second end of the body,
   wherein the first and second locking flanges are each configured to releasably engage corresponding structure of a shell of an optoelectronic transceiver module such that the collar clip can be releasably installed on the shell.

3. The optoelectronic transceiver module as recited in claim 1, wherein the collar clip comprises sheet metal.

4. The optoelectronic transceiver module as recited in claim 1, wherein each of the plurality of extended elements is configured to contact a cage of a host device when the collar clip is installed on the shell and the optoelectronic transceiver module is inserted into the cage.

5. The optoelectronic transceiver module as recited in claim 1, wherein the optoelectronic transceiver module is substantially compliant with the SFP+ MSA.

6. The optoelectronic transceiver module as recited in claim 1, wherein the shell further defines a recess such that at least a portion of the body sits in the recess and is substantially flush with an adjacent surface of the shell.

7. An optoelectronic transceiver module comprising:
   a multi-piece shell;
   a PCB at least partially positioned within the multi-piece shell;
   a TOSA electrically connected to the PCB;
   a ROSA electrically connected to the PCB; and
   a collar clip comprising:
      a body sized and configured to partially encircle the multi-piece shell;
      a first locking flange defined on a first end of the body; and a second locking flange defined on a second end of the body, wherein the first and second locking flanges are each configured to releasably engage corresponding structure of the multi-piece shell such that the body holds at least two pieces of the multi-piece shell together when the first and second locking flanges are engaged with the corresponding structure.

8. The optoelectronic transceiver module as recited in claim 7, wherein the collar clip further comprises a plurality of extended elements located on at least one edge of the body.

9. The optoelectronic transceiver module as recited in claim 8, wherein each extended element in a pair of the extended elements is separated from the other extended element in the pair by a cavity, each cavity being configured to receive a corresponding post of a multi-piece shell of an optoelectronic module.

10. The optoelectronic transceiver module as recited in claim 7, wherein the collar clip comprises sheet metal.

11. The optoelectronic transceiver module as recited in claim 7, wherein the optoelectronic transceiver module is substantially compliant with the SFP+ MSA.

12. The optoelectronic transceiver module as recited in claim 7, wherein the multi-piece shell further defines a recess such that at least a portion of the body sits in the recess and is substantially flush with an adjacent surface of the multi-piece shell.

13. An optoelectronic transceiver module comprising:
a multi-piece shell, at least one piece of the multi-piece shell defining a plurality of posts;
a PCB at least partially positioned within the multi-piece shell;
a TOSA electrically connected to the PCB;
a ROSA electrically connected to the PCB; and
a collar clip comprising:
a body partially encircling the multi-piece shell;
a plurality of extended elements located on at least one edge of the body, each extended element in a pair of the extended elements separated from the other extended element in the pair by a cavity, each of the plurality of posts positioned in a respective cavity;
a first locking flange defined on a first end of the body; and
a second locking flange defined on a second end of the body,
wherein each of the first and second locking flanges engages corresponding structure of the multi-piece shell such that the body holds at least two pieces of the multi-piece shell together.

14. The optoelectronic transceiver module as recited in claim 13, wherein the collar clip comprises sheet metal.

15. The optoelectronic transceiver module as recited in claim 13, wherein the optoelectronic transceiver module is substantially compliant with the SFP+ MSA.

16. The optoelectronic transceiver module as recited in claim 13, wherein the multi-piece shell further defines a recess such that at least a portion of the body sits in the recess and is substantially flush with an adjacent surface of the multi-piece shell.

17. The optoelectronic transceiver module as recited in claim 14, wherein the multi-piece shell comprises:
a rotatable top shell that is die-cast from zinc; and
a bottom shell that is die-cast from zinc,
wherein the first and second locking flanges are each engaged with corresponding structure of the multi-piece shell such that the body is holding the rotatable top shell and the bottom shell together and preventing the rotatable top shell from rotating away from the bottom shell.

18. The optoelectronic transceiver module as recited in claim 14, wherein each of the plurality of extended elements is configured to contact a cage of a host device when the optoelectronic transceiver module is inserted into the cage and to elastically deform upon insertion of the optoelectronic transceiver module into the cage.

* * * * *